United States Patent
Kim

(10) Patent No.: US 9,046,259 B2
(45) Date of Patent: Jun. 2, 2015

(54) LIGHTING APPARATUS

(71) Applicant: SAMSUNG ELECTRONICS CO., LTD., Suwon-si, Gyeonggi-do (KR)

(72) Inventor: Sung-jin Kim, Suwon-si (KR)

(73) Assignee: SAMSUNG ELECTRONICS CO., LTD., Suwon-Si (KR)

( * ) Notice: Subject to any disclaimer, the term of this patent is extended or adjusted under 35 U.S.C. 154(b) by 0 days.

(21) Appl. No.: 14/199,783

(22) Filed: Mar. 6, 2014

(65) Prior Publication Data

US 2014/0254151 A1    Sep. 11, 2014

(30) Foreign Application Priority Data

Mar. 7, 2013    (KR) ......................... 10-2013-0024543

(51) Int. Cl.
*F21V 29/00*    (2006.01)
*F21K 99/00*    (2010.01)

(52) U.S. Cl.
CPC ............. *F21V 29/2206* (2013.01); *F21K 9/135* (2013.01); *F21K 9/1355* (2013.01); *F21V 29/74* (2015.01)

(58) Field of Classification Search
CPC .................................. F21V 29/74; F21V 9/135
USPC ................ 362/235, 249.02, 373, 294, 646
See application file for complete search history.

(56) References Cited

U.S. PATENT DOCUMENTS

| | | | | |
|---|---|---|---|---|
| 6,234,649 B1 * | 5/2001 | Katougi | ......................... | 362/248 |
| 7,661,854 B1 * | 2/2010 | Yang et al. | .................... | 362/373 |
| 8,419,240 B2 * | 4/2013 | Lim | ............................... | 362/373 |
| 8,421,329 B2 * | 4/2013 | Liang et al. | .................... | 313/317 |
| 8,596,821 B2 * | 12/2013 | Brandes et al. | .......... | 362/249.02 |
| 2011/0215345 A1 | 9/2011 | Tarsa et al. | | |
| 2013/0070456 A1 * | 3/2013 | Jang et al. | ..................... | 362/235 |

FOREIGN PATENT DOCUMENTS

| | | |
|---|---|---|
| JP | 2004-031055 A | 1/2004 |
| JP | 2005-183035 A | 7/2005 |
| JP | 2011-192398 A | 9/2011 |
| KR | 20-2008-0005356 U | 11/2008 |
| KR | 10-2010-0066685 A | 6/2010 |

* cited by examiner

*Primary Examiner* — Anabel Ton
(74) *Attorney, Agent, or Firm* — McDermott Will & Emery LLP

(57) ABSTRACT

Provided is a lighting apparatus having omnidirectional light distribution characteristics. The lighting apparatus includes: a first light-emitting module emitting light; a second light-emitting module emitting light in a direction different from the first light-emitting module; and a heat dissipating unit that is disposed between the first and second light-emitting modules. The heat dissipating unit dissipates heat generated in the first and second light-emitting modules.

17 Claims, 12 Drawing Sheets

LIGHTING APPARATUS

CROSS-REFERENCE TO RELATED APPLICATIONS

This application claims the benefit of priority to Korean Patent Application No. 10-2013-0024543, filed on Mar. 7, 2013, in the Korean Intellectual Property Office, the disclosure of which is incorporated herein in its entirety by reference.

BACKGROUND

The inventive concept relates to a lighting apparatus, and more particularly, to a lighting apparatus having light distribution characteristics of a large angle.

A light-emitting diode (LED) is a semiconductor device that is capable of forming various light colors by functioning as a light-emitting source via a PN junction of a compound semiconductor. Recently, a blue LED and an ultraviolet LED, which are formed by using nitride having excellent physical and chemical characteristics, have been introduced. Also, white light and other monochromic light have recently been able to be formed by using the blue or ultraviolet LED and a phosphorescent material, thus broadening the range of applications of a light-emitting device.

Recently, a LED has been used not only as a backlight of a display apparatus but also as a high output and high efficiency light source used in various lighting apparatuses, such as general lighting, decorative lighting, or local lighting.

SUMMARY

The inventive concept provides a lighting apparatus in which an irradiation angle of light emitted from a light source may be improved.

An exemplary embodiment of the inventive concept provides a lighting apparatus comprising: a first light-emitting module emitting light; a second light-emitting module emitting light in a direction different from the first light-emitting module; and a heat dissipating unit that is disposed between the first and second light-emitting modules. The heat dissipating unit dissipates heat generated in the first and second light-emitting modules.

The first light-emitting module may be disposed on a first surface of the heat dissipating unit, and the second light-emitting module may be disposed on a second surface of the heat dissipating unit that is separated from the first surface.

The second surface may be opposite to the first surface.

The lighting apparatus may further comprise: a first cover disposed on the first surface of the heat dissipating unit to protect the first light-emitting module; and a second cover disposed on the second surface of the heat dissipating unit to protect the second light-emitting module.

The first and second covers may be formed of a transparent material in which a diffusion material is mixed, to diffuse light emitted from the first and second light-emitting modules.

The first light-emitting module and the second light-emitting module may each comprise: at least one light-emitting device; and a circuit board on which the at least one light-emitting device is mounted.

The lighting apparatus may further comprise: a driving circuit unit providing driving power to the first light-emitting module and the second light-emitting module; and a housing unit in which the driving circuit unit is disposed.

The heat dissipating unit may have a cylindrical shape including a central inner space, wherein an upper portion of the housing unit is disposed in the inner space, and the first light-emitting module may be disposed on an upper surface of the heat dissipating unit, and the second light-emitting module may be disposed on a lower surface of the light-emitting module to surround the housing unit.

The lighting apparatus may further comprise a switching unit that controls the driving power to be selectively provided to the first light-emitting module and the second light-emitting module.

A reflecting unit reflecting a portion of light emitted from the second light-emitting module may be disposed on an external surface of the housing unit.

The reflecting unit may be formed by coating a highly reflective material on the housing unit.

The heat dissipating unit may comprise a plurality of heat dissipation fins.

According to another exemplary embodiment of the inventive concept, there is provided a lighting system comprising: a lighting apparatus comprising a first light-emitting unit and a second light-emitting unit that each include at least one light-emitting device and emit light in different directions and a heat dissipating unit that is disposed between the first and second light-emitting units and dissipates heat; and a control unit that controls driving power provided to each of the first and second light-emitting units.

The lighting apparatus may further comprise: a driving circuit unit that supplies power to the first light-emitting unit and the second light-emitting unit; a housing unit that insulates the driving circuit unit from the outside; and a socket unit that connects external power to the driving circuit unit.

The lighting system may further comprise a sensor unit that senses an amount of external light, wherein the control unit calculates near luminous intensity by using a signal output from the sensor unit and generates a control signal corresponding to the near luminous intensity.

Another exemplary embodiment of the inventive concept provides a lighting apparatus comprising at least two light-emitting modules disposed on different surfaces of a heat dissipating unit, wherein the at least two light-emitting modules are configured to emit light in different directions.

The different surfaces may include a first surface and a second surface opposing to the first surface of the heat dissipation unit.

The lighting apparatus may further include at least two covers disposed on the different surfaces of the heat dissipation unit, wherein the at least two covers are configured to protect the at least two light-emitting modules.

Each lighting-emitting module may include a nano-light-emitting structure. The nano-light-emitting structure may include a first conductivity type semiconductor layer as a nano-core, and an active layer and a second conductive type semiconductor layer as shell layers surrounding the nano-core.

BRIEF DESCRIPTION OF THE DRAWINGS

Exemplary embodiments of the inventive concept will be more clearly understood from the following detailed description taken in conjunction with the accompanying drawings in which.

DETAILED DESCRIPTION OF THE EMBODIMENTS

Figure 1:
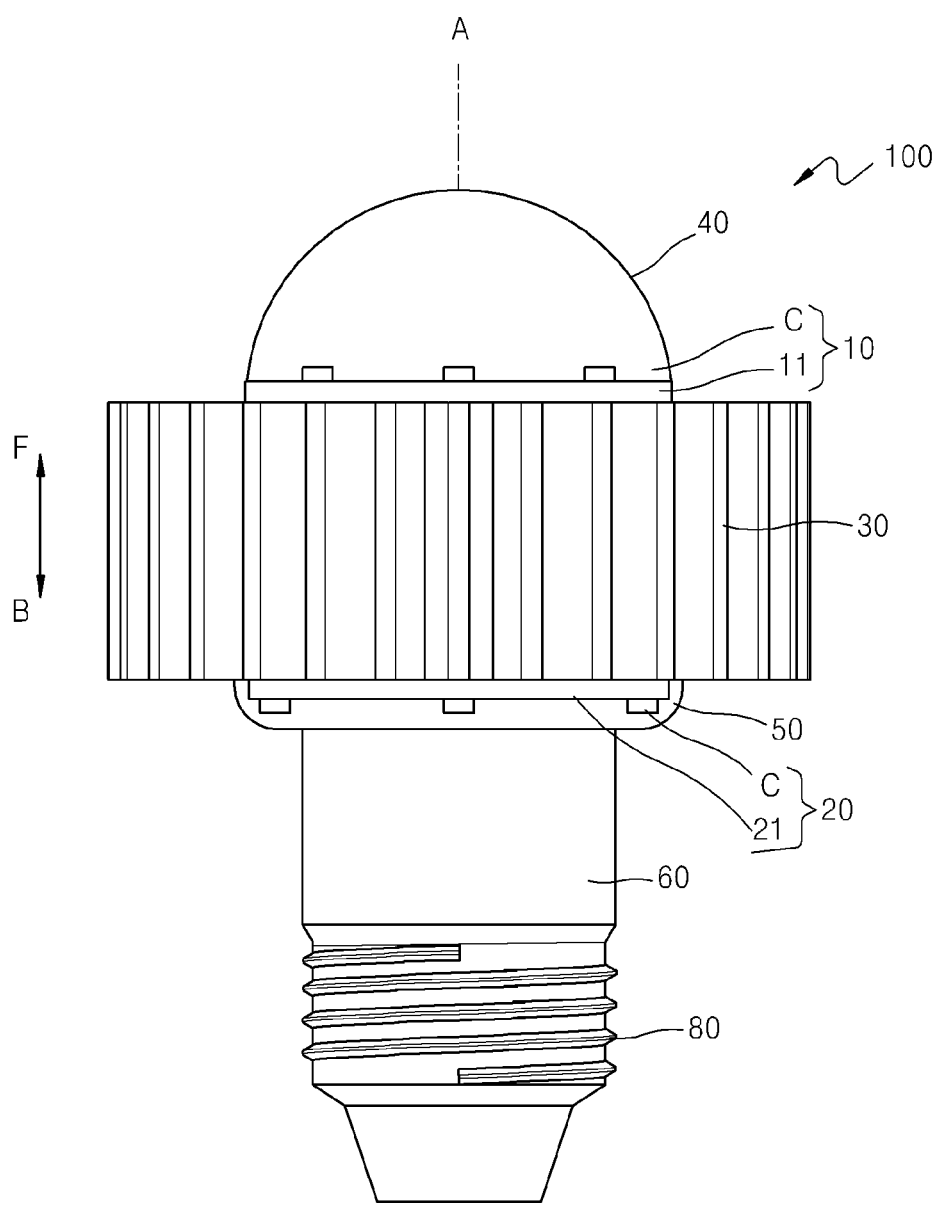
FIG. 1 is a side view of a lighting apparatus according to an embodiment of the inventive concept.

Hereinafter, the inventive concept will be described more fully with reference to the accompanying drawings, in which exemplary embodiments of the invention are shown. However, these embodiments are provided so that this disclosure will be thorough and complete to those of ordinary skill in the art. As the inventive concept allows for various changes and many different forms, particular embodiments will be illustrated in the drawings and described in detail in the written description. However, this is not intended to limit the inventive concept to particular modes of practice, and it is to be appreciated that all changes, equivalents, and substitutes that do not depart from the spirit and technical scope of the inventive concept are encompassed in the inventive concept. Like reference numerals in the drawings denote like elements. In the drawings, measurements of elements are expanded or reduced for clarity of the inventive concept.

The terms used in the present specification are merely used to describe particular embodiments, and are not intended to limit the inventive concept. An expression used in the singular encompasses the expression of the plural, unless it has a clearly different meaning in the context. In the present specification, it is to be understood that the terms such as "including" or "having," etc., are intended to indicate the existence of the features, numbers, steps, actions, components, parts, or combinations thereof disclosed in the specification, and are not intended to preclude the possibility that one or more other features, numbers, steps, actions, components, parts, or combinations thereof may exist or may be added.

Unless defined differently, all terms used in the description including technical and scientific terms have the same meaning as generally understood by those skilled in the art. Terms as defined in a commonly used dictionary should be construed as having the same meaning as in an associated technical context, and unless defined apparently in the description, the terms are not ideally or excessively construed as having formal meaning.

As used herein, the term "and/or" includes any and all combinations of one or more of the associated listed items. Expressions such as "at least one of," when preceding a list of elements, modify the entire list of elements and do not modify the individual elements of the list.

Figure 2:
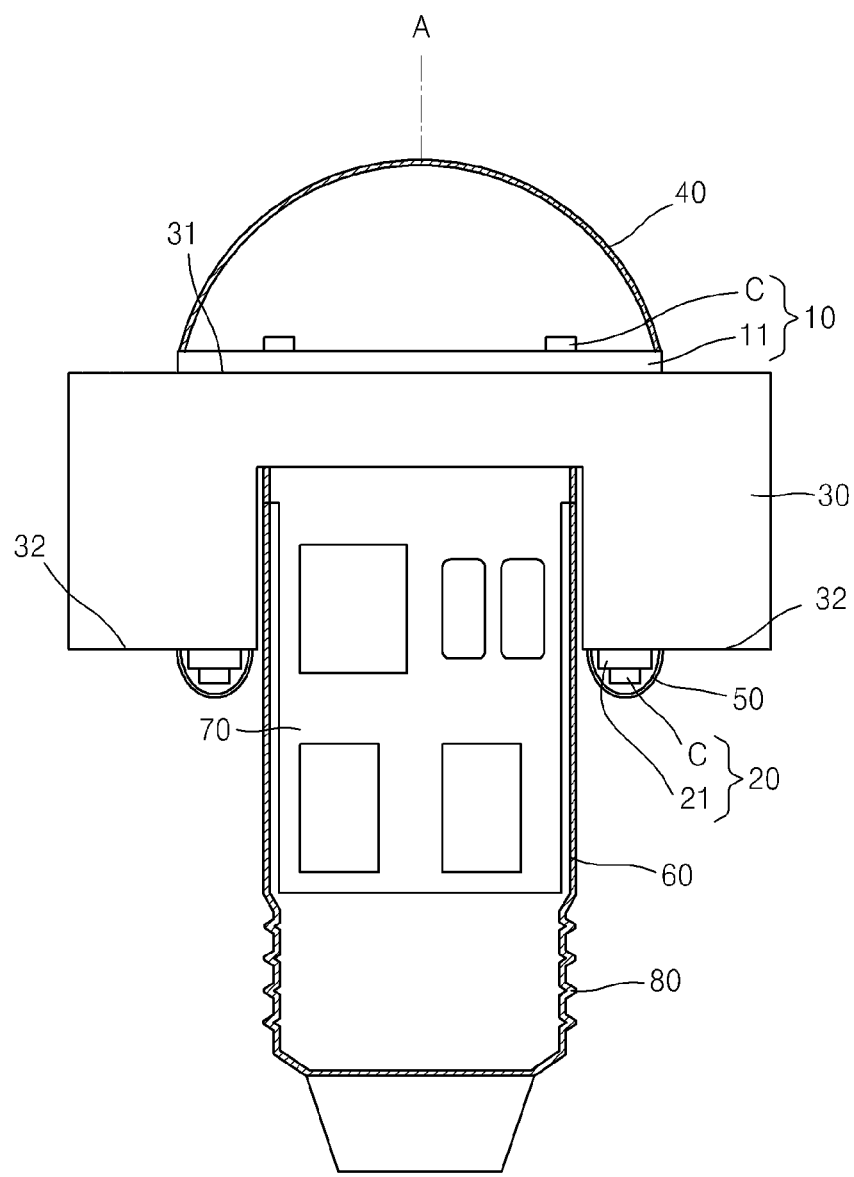
FIG. 2 is a side cross-sectional view of the lighting apparatus of FIG. 1 according to an embodiment of the inventive concept.
Figure 3:
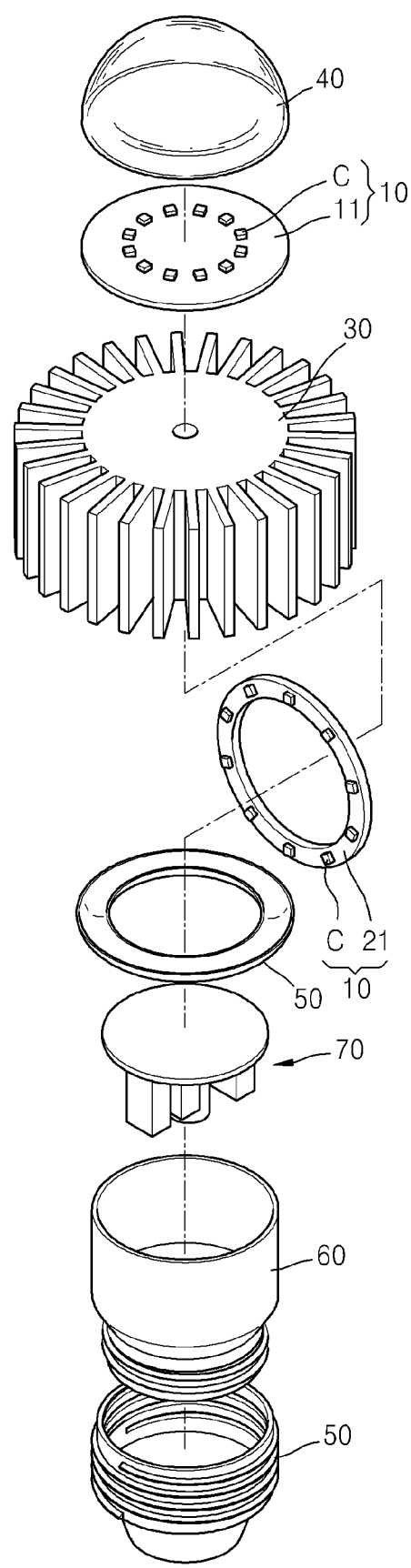
FIG. 3 is a disassembled perspective view of the lighting apparatus of FIG. 1 according to an embodiment of the inventive concept.

FIG. 1 is a side view of a lighting apparatus 100 according to an embodiment of the inventive concept. FIG. 2 is a side cross-sectional view of the lighting apparatus 100 of FIG. 1 according to an embodiment of the inventive concept. FIG. 3 is a disassembled perspective view of the lighting apparatus 100 of FIG. 1 according to an embodiment of the inventive concept.

Referring to FIGS. 1 through 3, the lighting apparatus 100 includes a first light-emitting module 10 and a second light-emitting module 20 emitting light in different directions and a heat dissipating unit 30 dissipating heat generated in the first light-emitting module 10 and the second light-emitting module 20 to the outside. Also, the lighting apparatus 100 may further include a driving circuit unit 70 and a socket unit 80 for providing power and a housing unit 60.

As illustrated in FIGS. 1 and 2, the first light-emitting module 10 may be disposed on a first surface of the heat dissipating unit 30, and the second light-emitting module 20 may be disposed on a second surface of the heat dissipating unit 30. The heat dissipating unit 30 may be disposed between the first light-emitting module 10 and the second light-emitting module 20. Accordingly, directions of light emitted from the first light-emitting module 10 and the second light-emitting module 20 may be different.

The first light-emitting module 10 may include at least one light-emitting device C emitting light and a circuit board 11 on which the at least one light-emitting device C is mounted. The at least one light-emitting device C may be mounted on an upper surface of the circuit board 11, and a lower surface of the circuit board 11 may contact the heat dissipating unit 30.

The light-emitting device C receives driving power to emit light. For example, the light-emitting device C may be a light-emitting diode (LED). While a plurality of light-emitting devices C are arranged in a ring form in FIG. 3, the inventive concept is not limited thereto, and a plurality of light-emitting devices C may be arranged in various arrangements, such as a polygonal arrangement or the like.

Also, as long as a necessary amount of light may be emitted from a single light-emitting device, the first light-emitting module 10 may include a single light-emitting device. Moreover, the first light-emitting module 10 may include a light-emitting device arranged on a central axis A of the lighting apparatus 100 and a plurality of light-emitting devices separated from the central axis A of the lighting device 100 by a predetermined distance.

When a plurality of light-emitting devices C are used, the light-emitting devices C may be homogeneous ones that emit light of the same wavelength. Alternatively, the plurality of light-emitting devices C may be heterogeneous ones that emit light of different wavelengths. For example, a light-emitting device may include a light-emitting device emitting white light by combining yellow, green, red, or orange phosphor and at least one of purple, blue, green, and infrared light-emitting devices. In this case, the lighting apparatus 100 may adjust a color rendering index (CRI) at the level of solar light, and may generate various types of white light. According to necessity, light of a predetermined wavelength, which may facilitate purple, blue, green, red, or orange visible light or growth of an infrared material, may be generated.

The circuit board 11 may have various forms according to various arrangements of the light-emitting device C. The circuit board 11 may be a circular flat plate or a ring-shaped flat plate. For example, when the first light-emitting module 10 is formed of a light-emitting device C arranged on the central axis A of the lighting device 100 and a plurality of light-emitting devices C that are separated from the central axis A of the lighting apparatus 100, the circuit board 11 may be a circular flat plate. However, when the first light-emitting module 100 is formed of a plurality of light-emitting devices C that are separated from the central axis of A of the lighting apparatus 100 without a light-emitting device C at a center portion, the circuit board 11 may be either a circular flat plate or a ring-shaped flat plate.

The circuit board 11 may be formed of a material having a heat dissipating function and excellent light-reflecting characteristics. For example, the circuit board 11 may be a FR4 type printed circuit board (PCB), and may be formed of an organic resin material including epoxy, triazine, silicone, or polyimide, or other organic resin materials, or may be formed of a ceramic material, such as a silicon nitride, MN, or $Al_2O_3$, a metal or a metal compound, and may include a metal core printed circuit board (MCPCB) or the like. Also, the circuit board 11 may be formed of a flexible PCB (FPCB), which is easily deformable and which may be deformed to a curved shape.

The light-emitting device C and the circuit board 11 will be further described in detail later.

The second light-emitting module 20 may include at least one light-emitting device C and a circuit board 21. The light-emitting device C may be mounted on a front surface of the circuit board 21, and a back surface of the circuit board 21 may contact the heat dissipating unit 30.

As illustrated in FIGS. 1 and 2, when the housing unit 60 is coupled to a center portion of the heat dissipating unit 30, the second light-emitting module 20 may be arranged on the second surface of the heat dissipating unit 30 while surrounding the housing unit 60. A plurality of light-emitting devices C may be symmetrically arranged with respect to the central axis A of the lighting apparatus 100 on the circuit board 21 of a ring shape. However, the embodiments of the inventive concept are not limited thereto. The circuit board 21 may have various forms and the arrangement of the light-emitting devices C may vary.

As the light-emitting devices C and the circuit board 21 of the second light-emitting module 20 are similar to the light-emitting devices C and the circuit board 11 of the first light-emitting module 10, a repeated description is omitted.

The heat dissipating unit 30 dissipates heat generated in the first light-emitting module 10 and the second light-emitting module 20 to the outside. The heat dissipating unit 30 may be disposed between the first light-emitting module 10 and the second light-emitting module 20 and be in contact with the circuit boards 11 and 21, dissipating heat generated by the light-emitting devices C to the outside.

The heat dissipating unit 30 includes a first surface 31 and a second surface 32 on which the first light-emitting module 10 and the second light-emitting module 20 are respectively mounted. The first light-emitting module 10 is arranged on the first surface 31, and the second light-emitting module 20 is arranged on the second surface 32 separated from the first surface 31. Also, the first surface 31 may be an upper surface of the heat dissipating unit 30, and the second surface 32 may be a lower surface of the heat dissipating unit 30. While the first surface 31 and the second surface 32 are illustrated as planar surfaces, the embodiments of the inventive concept are not limited thereto, and the first surface 31 and the second surface 32 may include curved surfaces.

The heat dissipating unit 30 may have a cylindrical shape, which includes a central inner space. The central inner space may also be cylindrical. As illustrated in FIG. 2, the housing unit 60 is coupled to the central inner space, and the driving circuit unit 70 is disposed in the housing unit 60. In addition, as illustrated in FIG. 3, the heat dissipating unit 30 includes a plurality of heat dissipating fins that are radially arranged with respect to the central axis A of the lighting apparatus 100 at lateral ends thereof. The heat dissipating fins are in the form of rectangular or polygonal panels, and may extend vertically. The heat dissipating fins extend a surface area for contacting the air so as to induce transfer of high-temperature heat from the light-emitting devices C to be conducted and dissipated to the outside. The radial arrangement shown in FIG. 3 allows for a rapid heat dissipation effect based on a principle that a density of heat is lower in an open space on the outside in than in a dense center portion so that a high-temperature heat is moved from a high density area to a low density area.

According to the current embodiment of the inventive concept, while the heat dissipating unit 30 has a cylindrical shape including heat dissipating fins at the lateral ends thereof, the embodiments of the inventive concept are not limited thereto. The shape or structure of the heat dissipating unit 30 may vary. For example, the heat dissipating unit 30 may have a polygonal pillar shape, and a heat dissipating hole or a concave-convex structure or the like may be formed at lateral ends of the heat dissipating units 30.

The heat dissipating unit 30 may be formed of a metal having an excellent thermal conductivity, such as aluminum (Al), copper (Cu), or etc. so that heat generated in the light-emitting apparatus C may be efficiently dissipated. Also, the heat dissipating unit 30 may be formed of a resin material having an excellent thermal conductivity, besides a metal.

The driving circuit unit 70 is configured to provide driving power to the first light-emitting module 10 and the second light-emitting module 20. Time when the driving power is applied and an amount of the driving power applied may vary. Also, the driving circuit unit 70 may convert power provided from the outside to driving power for driving the light-emitting device C. Also, the driving circuit unit 70 may selectively provide the driving power to the first light-emitting module 10 and/or the second light-emitting module 20. For example, driving power may be provided to only one of the first light-emitting module 10 and the second light-emitting module 20. Alternatively, driving power may be provided to only some of the plurality of light-emitting devices C included in the first light-emitting module 10 and the second light-emitting module 20 based on different schemes.

The driving circuit unit 70 may transmit or receive a signal from the outside via an external sensor. To this end, the driving circuit unit 70 includes an integrated circuit. The time when the driving power is applied to the first light-emitting module 10 and/or the second light-emitting module 20 and the amount of the driving power may vary according to a signal received via the external sensor.

The housing unit 60 includes the driving circuit unit 70 thereinside and protect the driving circuit unit 70 from the outside. The housing unit 60 may have a hollow cylindrical shape, and an upper radius and a lower radius thereof may be identical or different. An upper end of the housing unit 60 is connected to the heat dissipating unit 30, and a lower end of the housing unit 60 is connected to the socket unit 80, through which external power is transferred to the driving circuit 70. At least a portion of the housing unit 60 may be disposed in the inner space of the heat dissipating unit 30. A horizontal cross-section of the housing unit 60 may be circular, but it is not limited thereto, and may also be rectangular or polygonal. The housing unit 60 may be formed of an insulating material, such as plastic, in order to insulate the driving circuit unit 70 disposed inside the housing unit 60 from the outside.

The lighting apparatus 100 may further include two, first and second covers 40 and 50 for respectively protecting the first light-emitting module 10 and the second light-emitting module 20. The first cover 40 is disposed on the first surface 31 of the heat dissipating unit 30 and surrounds the first light-emitting module 10. The second cover 50 is disposed on the second surface 32 of the heat dissipating unit 30 and surrounds the second light-emitting module 20. As the lighting apparatus 100 include the first cover 40 and the second cover 50 for the second light-emitting module 20, separately, the heat dissipating unit 30 is disposed between the first light-emitting module 10 and the second light-emitting module 20, and a lateral side of the heat dissipating unit 30 may not be covered by the first and second covers 40 and 50 but be exposed at the same time. Consequently, heat dissipating characteristics of the heat dissipating unit 30 are not decreased.

The first cover 40 may be hemispherical, and the second cover 50 may have a half-tube shape. However, the shapes of the first cover 40 and the second cover 50 are not limited thereto, and may vary according to a shape of a circuit board included in the first light-emitting module 10 and the second light-emitting module 20.

A diffusion material may be coated on inner side ends of the first and second covers 40 and 50 or may be filled therein in order that light emitted from the first and second light-emitting modules 10 and 20 may easily diffuse. The first and second covers 40 and 50 may be formed of diffusion sheets arranged apart from the first and second light-emitting modules 10 and 20 by a predetermined distance. Also, the first and second covers 40 and 50 may be formed of a transparent plastic, glass, or a semi-transparent plastic of a material base such as poly carbonate (PC), poly methyl methacrylate (PMMA) or acrylic or a mixture of a transparent material as described above and a diffusion material. Further, a phosphor may be mixed in the material of the first and second covers 40 and 50 so as to provide color conversion of light emitted from the first and second light-emitting modules 10 and 20.

A micro-pattern (not shown) may be formed on at least a surface of the first and second covers 40 and 50. A micro-pattern formed on a surface or two surfaces of the first and second covers 40 and 50 performs the function of diffusing light, and in this case, the first and second covers 40 and 50 may be formed of a transparent material which is not mixed with a diffusion material, or formed of a transparent material mixed with a diffusion material.

The lighting apparatus 100 according to the current embodiment of the inventive concept includes the first light-emitting module 10 that is disposed above the heat dissipating unit 30 and emits light in a forward direction (F) as well as the second light-emitting module 20 that is disposed below the heat dissipating unit 30 and emits light in a backward direction (B), thereby improving the light distribution characteristics of the lighting apparatus 100. Light emitted from the first light-emitting module 10 and the second light-emitting module 20 may be irradiated omnidirectionally with respect to the lighting apparatus 100. Accordingly, the lighting apparatus 100 may have omnidirectional light distribution characteristics like those of an incandescent light bulb.

The circuit boards 11 and 21 applied to the first light-emitting module 10 and the second light-emitting module 20 illustrated in FIG. 1 may have various structures or may be formed of various materials. Hereinafter, a circuit board which may be advantageously applied to the lighting apparatus 100 will be described in detail with reference to FIGS. 4 through 7.

Figure 4:
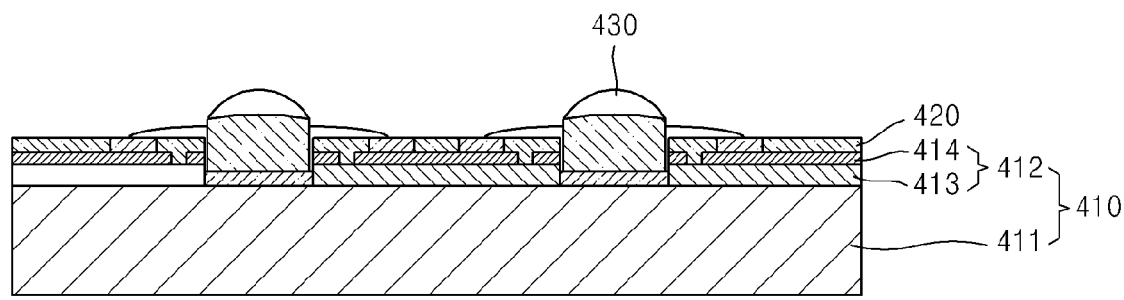
FIGS. 4 to 6 illustrate a circuit board applied to a lighting apparatus, according to embodiments of the inventive concept.

FIG. 4 illustrates a circuit board 410 applied to a lighting apparatus, according to an embodiment of the inventive concept. As illustrated in FIG. 4, the circuit board 410 is formed by stacking an insulation layer 413 and a resin coated copper (RCC) thin film 412 formed of a copper thin film, on a heat dissipating support substrate 411, and a protection layer 420 formed of a photo-solder resister (PSR) is stacked on a circuit layer 414 of RCC thin film 412. Also, a metal copper clad laminate (MCCL), in which at least one groove, into which a LED chip or a LED package 430 is mounted, is formed by removing a portion of the RCC thin film 412. In the circuit board 410, an insulation layer at a lower region of the LED chip or the LED package 430 in which a light source is received is removed so that the light source contacts the heat dissipation supporting substrate 411 and heat generated in the light source is directly transferred to the heat dissipating support substrate 411, thereby improving the heat dissipating performance of the circuit board 410.

Figure 5:
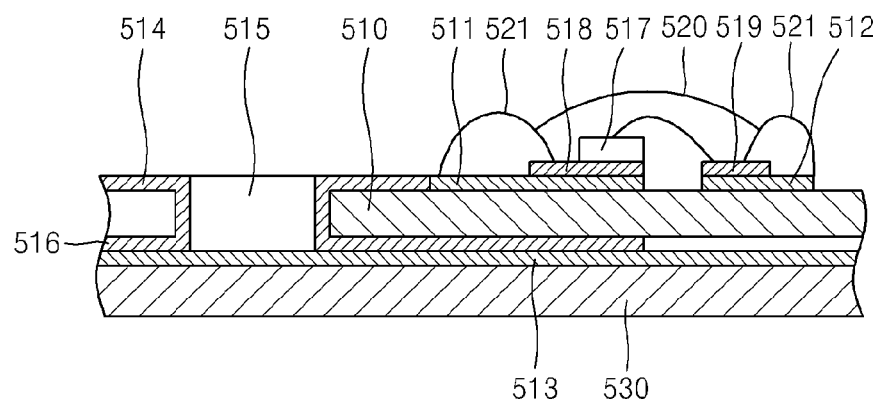

FIG. 5 illustrates a circuit board 510 applied to a lighting apparatus according to another embodiment of the inventive concept. As illustrated in FIG. 5, the circuit board 510 is an insulation substrate (hereafter, the circuit board 510 is referred to as a substrate), and includes circuit patterns 511 and 512 formed on an upper surface thereof and of a copper thin film, and an insulation thin film 513 is coated on a lower surface of the circuit board 510 to a small thickness. The coating may be performed by using various methods such as sputtering or spraying. Also, upper and lower heat diffusion plates 514 and 516 are respectively formed on upper and lower surfaces of the substrate 510 to dissipate heat generated in a LED chip 517 or a LED package including the LED chip 517, LED electrodes 518 and 519, a plastic molding case 521, or a lens 520; particularly, the upper heat diffusion plate 514 directly contacts the circuit pattern 511. For example, an insulation material, which the insulation thin film 513 is formed of, has a lower thermal conductivity than a thermal pad, but by forming the insulation thin film 513 to a very small thickness, a lower thermal resistance than that of the thermal pad may be provided. Heat generated in the LED chip 517 may pass through the upper heat diffusion plate 514 and may be conducted to the lower thermal diffusion plate 516 and dissipated to a chassis 530.

A through hole 515 may be formed in the substrate 510 and the upper and lower heat diffusion plates 514 and 516 in a vertical direction with respect to the substrate 510. The substrate 510 may be an insulation substrate and may be formed by coating a copper thin film on a FR4-core, which is ceramic or an epoxy resin-based material, and circuit patterns may be formed thereon by using an etching operation.

Figure 6:
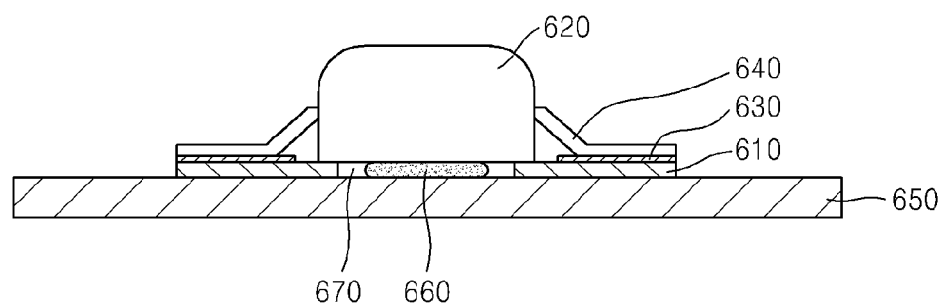

FIG. 6 is a cross-sectional view illustrating a circuit board applied to a lighting apparatus, according to another embodiment of the inventive concept. The circuit board 610 illustrated in FIG. 6 may be a slim-type circuit board. Referring to FIG. 6, the circuit board 610 may include a flexible circuit board 610 in which at least one through hole 670 is formed, a circuit pattern 630 formed on an upper surface of the flexible circuit board 610, a support substrate 650 on which the flexible circuit board 610 is mounted, and a heat dissipation adhesive 660 that is formed in the through hole 670 and couples a lower surface of a LED chip or a LED package 620 and an upper surface of the support substrate 650. The lower surface of the LED package 620 may include a lower surface of a chip package through which a bottom surface of a LED chip is directly exposed, a lower surface of a lead frame on which a LED chip is mounted, or a metal block.

As noted earlier, the circuit board according to the current embodiment of the inventive concept includes a flexible substrate, and thus, a thickness and weight thereof may be reduced. As a result, the circuit board may be slim and lightweight and the manufacturing costs thereof may be reduced. Also, by directly coupling the LED chip or the LED package 620 to the support substrate 650 by using the heat dissipation adhesive 660, the heat dissipation efficiency of heat generated in the LED chip or the LED package 620 may be increased.

With reference to FIGS. 4 through 6, the circuit boards that may be applied to the lighting apparatus 100 of FIG. 1 have been described above with reference to FIGS. 4 through 6. However, various circuit boards having other structures and materials may be used for the lighting apparatus 100.

The light-emitting devices C used in the lighting apparatus 100 of FIG. 1 may be a LED chip or a LED package of various forms including a LED chip. Hereinafter, a LED chip and a LED package that may be advantageously used in the lighting apparatus 100 according to the current embodiment of the inventive concept will be described in detail.

Figure 7:
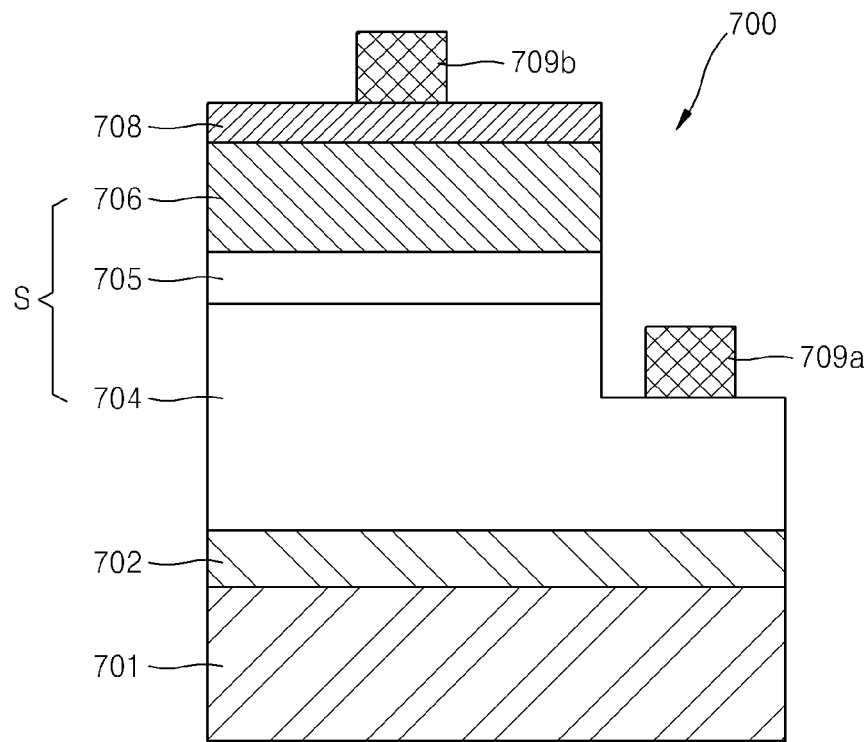
FIGS. 7 and 8 illustrate a light-emitting diode (LED) chip applied to a lighting apparatus according to an embodiment of the inventive concept.

FIG. 7 is a cross-sectional view illustrating a LED chip 700 according to an embodiment of the present inventive concept.

As illustrated in FIG. 7, the LED chip 700 includes a light emission stack S formed on a semiconductor growth substrate 701. The light emission stack S includes a first conductivity-type semiconductor layer 704, an active layer 705, and a second conductivity-type semiconductor layer 706.

Also, the light emission stack S includes an ohmic electrode layer 708 formed on the second conductivity-type semiconductor layer 706, and first and second electrodes 709a and 709b are formed on upper surfaces of the first conductivity-type semiconductor layer 704 and the ohmic contact layer 708, respectively.

The semiconductor growth substrate 701 may be formed as an insulating substrate, a conductive substrate, or a semiconductor substrate. For example, the semiconductor growth substrate 701 may be SiC, Si, $MgAl_2O_4$, MgO, $LiAlO_2$, $LiGaO_2$, or GaN. To epitaxially grow GaN, a GaN substrate of a homogeneous type may preferably be used, but it is difficult to manufacture a GaN substrate, thereby resulting in higher costs of manufacturing the GaN substrates.

As a heterogeneous substrate, sapphire or silicon carbide (SiC) substrates are mainly used. In detail, a sapphire substrate is used more frequently than a silicon carbide substrate, which is relatively expensive. When a heterogeneous substrate is used, defects such as dislocation increases due to a difference in lattice constants between a substrate material and a thin film material may occur. Also, due to a difference in thermal expansion coefficients between a substrate material and a thin film material, the substrate 701 may bend due to a change in temperature, and this bending may cause cracks in the thin film. However, these defects can be eliminated or reduced substantially by using a buffer layer 702 between the semiconductor growth substrate 701 and the light emission stack S formed of a GaN-based material.

The semiconductor growth substrate 701 may be entirely or partially removed or patterned during a chip manufacturing operation in order to improve optical or electrical characteristics of a LED chip before or after growing a LED structure.

For example, in a case of a sapphire substrate, a laser beam may be irradiated to an interface between the sapphire substrate and a semiconductor layer, through the sapphire substrate to thereby separate the sapphire substrate, but a silicon substrate or a silicon carbide substrate may be removed by using methods, such as polishing or etching.

In addition, when removing the semiconductor growth substrate 701, another support substrate may be used, and in this case, in order to improve the optical efficiency of the LED chip 700, a support substrate may be bonded to the opposite side of the original semiconductor growth substrate 701 by using a reflective metal, or a reflective structure may be inserted into a middle portion of an adhesion layer.

Further, substrate patterning may be used to form a concave-convex structure or an inclined surface before or after growing a LED structure on a main surface (on a surface or on two surfaces) or a lateral surface of the substrate so as to improve light extraction efficiency. The pattern may be selected from a range of 5 nm to 500 μm, and may be any regular or irregular pattern which is able to improve a light extraction efficiency. The pattern may have various shapes such as a pillar, a cone, a hemisphere, a polygon, or the like.

The sapphire substrate is a crystal having a hexa-thombo R3c symmetry where lattice constants in a c-axis direction and an a-axis direction are respectively 13.001 and 4.758, and includes surfaces such as a C(0001) surface, an A(1120) surface, and a R(1102) surface. Here, it is relatively easy to grow a nitride thin film on the C surface, which is relatively stable at a high temperature and thus is frequently used as a growth substrate for growing a nitride film.

Another example of the substrate is a silicon (Si) substrate, which is appropriate for a large aperture and is relatively inexpensive. Thus, by using the Si substrate mass production of a growth substrate can be obtained.

The Si substrate absorbs light generated in a GaN-based semiconductor to reduce an external quantum efficiency of a light-emitting device. Thus, according to necessity, the Si substrate may be removed and a support substrate, such as a Si, Ge, SiAl, ceramic, or metal substrate including a reflective layer, may be additionally formed.

When growing a GaN thin film on a heterogeneous substrate, such as the Si substrate, dislocation density increases due to inconsistency in lattice constants of a substrate material and a thin film material, and cracks or bending may be caused due to a difference in thermal expansion coefficients. To prevent dislocation and cracks of the light emission stack S, the buffer layer 702 is disposed between the semiconductor growth substrate 701 and the light emission stack S. The buffer layer 702 adjusts a degree of bending of the semiconductor growth substrate 701 when growing an active layer, thereby reducing a wavelength distribution in a wafer.

The buffer layer 702 may be formed of $Al_xIn_yGa_{1-x-y}N$ ($0<x<1$, $0<y<1$), particularly, GaN, AlN, AlGaN, InGaN, or InGaNAlN, and also of $ZrB_2$, $HfB_2$, ZrN, HfN, TiN, or the like. Also, the buffer layer 702 may be formed by combining a plurality of layers or by gradually varying a composition of one of the above-described materials.

A Si substrate has a thermal expansion coefficient that varies greatly from that of GaN. When growing a GaN-based thin film on a Si substrate, a GaN thin film is grown at a high temperature and then is cooled to room temperature, and here, tensile stress is applied to the GaN thin film due to a difference in thermal expansion coefficients between the Si substrate and the GaN thin film and cracks may be easily formed accordingly. To prevent the cracks, however, growing may be performed such that compressive stress is applied to the GaN thin film to thereby compensate for the tensile stress.

Si has a different lattice constant from that of GaN, and thus defects are highly likely to be generated in a Si substrate. When a Si substrate is used, not only defects but also stress have to be controlled in order to prevent bending. Thus, a multi-structure buffer layer is applied to the Si substrate.

For example, AlN is formed on the semiconductor growth substrate 701. To prevent reaction between Si and Ga, a material not containing Ga may preferably be used. For example, not only AlN but also SiC or the like may be used. AlN is grown at a temperature in a range between 400 to 1300 degrees by using an Al source and an N source. According to necessity, an AlGaN intermediate layer may be inserted into a plurality of AlN layers so as to control a stress.

The light emission stack S having a multi-layered structure of a Group III nitride semiconductor will be further described. First and second conductivity-type semiconductor layers 704 and 706 may be formed of a semiconductors doped with n-type and p-type impurities, but not limited thereto, and they may also respectively be p-type and n-type semiconductor layers. For example, the first and second conductivity-type semiconductor layers 704 and 706 may be formed of a Group III nitride semiconductor, for example, a material having a composition of $Al_xIn_yGa1-x-yN$ ($0<x<1$, $0<y<1$, $0<x+y<1$). However, the first and second conductivity-type semiconductor layers 704 and 706 may also be formed of an AlGaInP-based semiconductor or an AlGaAs-based semiconductor.

The first and second conductivity-type semiconductor layers 704 and 706 may have a single layer structure, or may also have a multi-layer structure with different compositions or thicknesses. For example, the first and second conductivity-type semiconductor layers 704 and 706 may include carrier injection layers which may respectively improve implantation efficiency of electrons and holes, and may also include superlattice structures of various forms.

The first conductivity-type semiconductor layer 704 may further include a current diffusion layer (not shown) adjacent to the active layer 705. The current diffusion layer may have a structure in which a plurality of $In_xAl_yGa(1-x-y)N$ layers having different compositions or different impurity content are repeatedly stacked, or an insulation material layer may be partially formed in the current diffusion layer.

The second conductivity-type semiconductor layer 706 may further include an electron blocking layer (not shown) adjacent to the active layer 705. The electron blocking layer may have a structure in which a plurality of $In_xAl_yGa(1-x-y)N$ layers of different compositions are stacked or may include at least one layer formed of $Al_yGa(1-y)N$, and has a greater band gap than the active layer 705 to thereby prevent electrons from flowing over to the second conductivity-type (p-type) semiconductor layer 706.

The light emission stack S is manufactured by using a metal oxide chemical vapor deposition (MOCVD) apparatus, and is manufactured by: supplying a reaction gas such as an organic metal compound gas (e.g., trimethyl gallium (TMG), trimethyl aluminum (TMA), or nitrogen-containing gas (ammonia ($NH_3$)) into a reaction container in which the semiconductor growth substrate 701 is installed; by maintaining a high temperature of the semiconductor growth substrate 701 at 900 to 1100 degrees; by growing a nitride gallium-based compound semiconductor on the semiconductor growth substrate 701; and by supplying an impurity gas according to necessity, thereby stacking the nitride gallium-based semiconductor as an undoped type, an n-type, or a p-type. As an n-type impurity, Si is well known, and examples of a p-type impurity include Zn, Cd, Be, Mg, Ca, and Ba; among these, Mg or Zn may be frequently used.

In addition, the active layer 705 disposed between the first and second conductivity-type semiconductor layers 704 and 706 may have a multi-quantum well (MQW) structure in which a quantum well layer and a quantum barrier layer are alternately stacked, and when a nitride semiconductor is used, a GaN/InGaN structure may be used, or a single quantum well (SQW) structure may also be used.

The ohmic contact layer 708 may increase an impurity density so as to reduce an ohmic contact resistance and an operating voltage of a device, thereby improving device characteristics. The ohmic contact layer 708 may be formed of GaN, InGaN, ZnO, or a graphene layer.

The first and second electrodes 709a or 709b may be formed of a material, such as Ag, Ni, Al, Rh, Pd, Ir, Ru, Mg, Zn, Pt, or Au, and may have a structure including at least two layers formed of a material, such as Ni/Ag, Zn/Ag, Ni/Al, Zn/Al, Pd/Ag, Pd/Al, Ir/Ag, Ir/Au, Pt/Ag, Pt/Al, or Ni/Ag/Pt.

The LED chip 700 illustrated in FIG. 7 is an example where the first and second electrodes 709a and 709b are directed in the same direction as a light extracting surface, but may also have other various structures such as a flip-chip structure in which the first and second electrodes 709a and 709b face the opposite side to the light extracting surface, a vertical structure in which the first and second electrodes 709a and 709b are respectively formed on opposite sides to each other, or a vertical-horizontal structure including an electrode structure in which a plurality of vias are formed in a chip in order to improve a current distribution efficiency and a heat dissipating efficiency.

Figure 8:
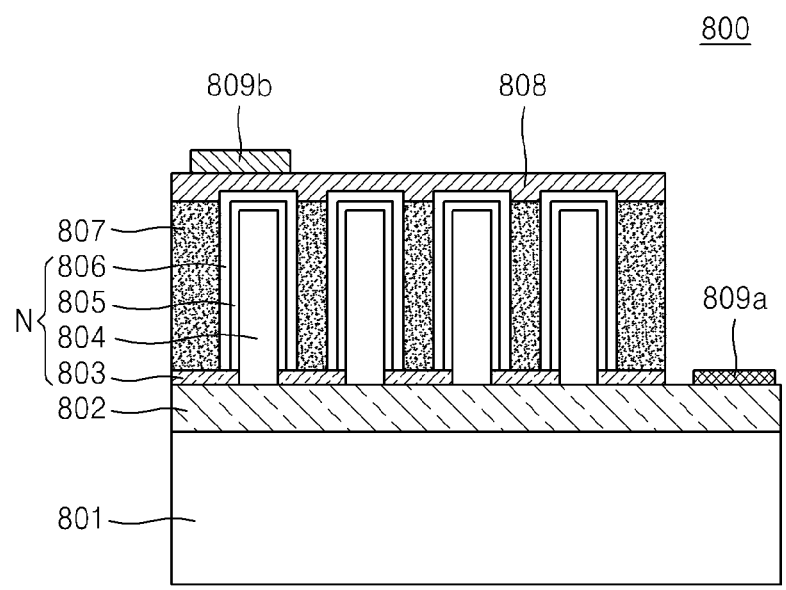

FIG. 8 is a cross-sectional view of a LED chip 800 according to another embodiment of the inventive concept.

Although a LED lighting apparatus provides an improved heat dissipating characteristics, in regard to an overall heat dissipating performance, it is preferable to use a LED chip, which generates a relatively small amount of heat, in a lighting apparatus. As a LED chip that satisfies this requirement, the LED chip 800, including a nanostructure as illustrated in FIG. 8 (hereinafter referred to as a "nano-LED chip" chip), may be used.

As illustrated in FIG. 8, the nano-LED chip 800 includes a nano-light-emitting structure N that includes a plurality of layers that are formed on a substrate 801. The nano-light-emitting structure N according to the current embodiment of the inventive concept has a core-shell structure, but it is not limited thereto, and may also have other structures, such as a pyramid structure or etc.

The nano-LED chip 800 includes a base layer 802 formed on the substrate 801. The base layer 802 is a layer that provides a growth surface of the nano-light-emitting structure N and may be the first conductivity-type semiconductor 704. A mask layer 803 having an open area for growing the nano-light-emitting structure N (particularly, cores) may be formed on the base layer 802. The mask layer 803 may be a dielectric material, such as $SiO_2$ or SiNx.

The nano-light-emitting structure N is formed by forming a first conductivity-type nano-core 804 by selectively growing a first conductivity-type semiconductor by using the mask layer 803 having an open area, and by forming an active layer 805 and a second conductivity-type semiconductor layer 806 on a surface of the first conductivity-type nano-core 804 as shell layers. Accordingly, the nano-light-emitting structure N may have a core-shell structure in which the first conductivity-type semiconductor is included as a nano-core, and the active layer 805 and the second conductivity-type semiconductor layer 806, which surround the nano-core, are included as shell layers.

The nano-LED chip 800 according to the current embodiment of the inventive concept includes a filling material 807 filled between layers of the nano-light-emitting structure N. The filing material 807 may structurally stabilize the nano-light-emitting structure N. The filling material 807 may be, without limitation, a transparent material, such as $SiO_2$. An ohmic contact layer 808 may be formed on the nano-light-emitting structure N to contact the second conductivity-type semiconductor layer 806. The nano-LED chip 800 includes the baser layer 802 formed of a first conductivity-type semiconductor and first and second electrodes 809a and 809b contacting the ohmic contact layer 808.

Light of at least two different wavelengths may be emitted from a single device by varying a diameter, components, or a doping density of the nano-light-emitting structure N. White light may be formed by appropriately adjusting light of different wavelengths in a single device without using a phosphor, and light of desired, various colors of white light with various color temperatures may be formed by combining a device with another LED chip or with a wavelength-converting material, such as a phosphor.

The nano-LED chip 800 as described above has a low coupling density, and thus, a heat generation amount thereof may be relatively small, and a light-emitting efficiency thereof may be increased by increasing a light emission surface area by using a nano-structure. Also, as a non-polar active layer may be formed in the nano-LED chip 800, a decrease in efficiency due to polarization may be prevented, and accordingly, a droop characteristic of the nano-LED chip 800 may also be improved.

Figure 9:
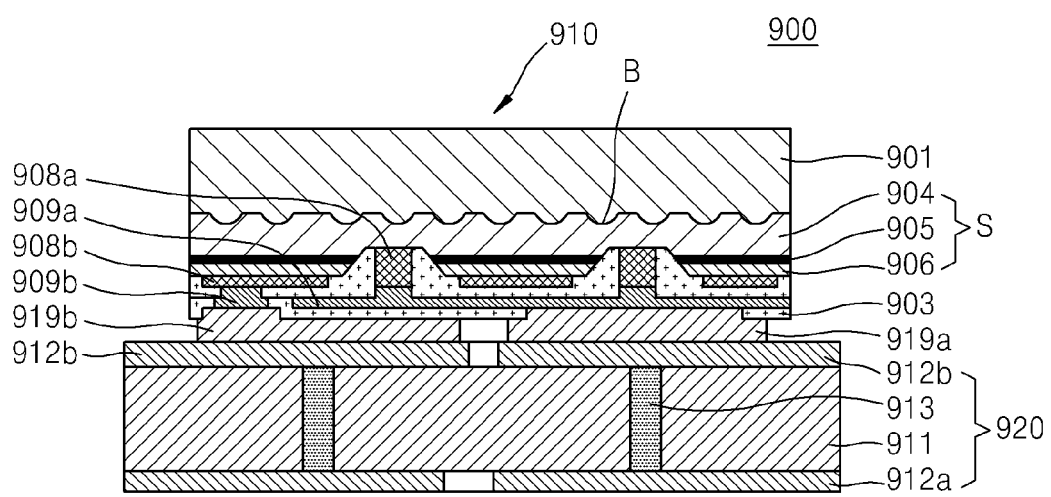
FIG. 9 illustrates a semiconductor light-emitting device applied to a lighting apparatus according to an embodiment of the inventive concept.

FIG. 9 is a cross-sectional view illustrating a semiconductor light-emitting device 900 that includes a LED chip 910 mounted on a mounting substrate 920. The semiconductor light-emitting device 900 is a lighting source to be applied to the lighting apparatus according to another embodiment of the inventive concept.

A LED chip 910 illustrated in FIG. 9 includes a light emission stack S disposed on a surface of a growth substrate 901 and first and second electrodes 908a and 908b disposed on an opposite side to the growth substrate 901 with respect to the light emission stack S. Also, the LED chip 910 includes an insulation unit 903 that is formed to cover the first and second electrodes 908a and 908b.

The first and second electrodes 908a and 908b may be connected to first and second electrode pads 919a and 919b via first and second electric connecting portions 909a and 909b.

The light emission stack S may include a first conductivity-type semiconductor layer 904, an active layer 905, and a second conductivity-type semiconductor layer 906 that are sequentially formed on the growth substrate 901. The first electrode 908a may be provided as a conductive via and contact the first conductivity-type semiconductor layer 904 by penetrating through the second conductivity-type semiconductor layer 906 and the active layer 905. The second electrode 908b may contact the second conductivity-type semiconductor layer 906.

The insulation unit 903 may include an open area that exposes at least a portion of the first and second electrodes 908a and 908b, and the first and second electrode pads 919a and 919b may contact the first and second electrodes 908a and 908b.

The first and second electrodes 908a and 908b may have a single-layer structure or a multi-layer structure formed of a conductive material respectively having ohmic characteristics with respect to the first and second conductivity-type semiconductor layers 904 and 906, and may be formed by depositing or sputtering at least one material, such as Ag, Al, Ni, Cr, or a transparent conductive oxide (TCO). The first and second 908a and 908b may be arranged in the same direction, and may be mounted on a lead frame in a flip-flop manner as described below. In this case, the first and second electrodes 908a and 908b are disposed in the same direction.

In particular, the first electric connecting portion 909a is formed on the first electrode 908a.

The number, shape, and pitch of the first electrode 908a and the first electric connecting portion 909a and a contact surface thereof with respect to the first conductivity-type semiconductor layer 904 may be appropriately adjusted so as to reduce contact resistance of the first electrode 908a and the first electric connecting portion 909a, and the first electrode 908a and the first electric connecting portion 909a may be arranged in rows and columns to improve a current flow.

Another electrode structure may include the second electrode 908b directly formed on the second conductive semiconductor layer 906 and the second electric connecting portion 909b formed on the second electrode 908b. Besides the function of forming an electric ohmic contact with respect to the second conductivity-type semiconductor layer 906, the second electrode 908b may be formed of a light-reflective material so as to effectively emit light emitted from the active layer 905 to the growth substrate 901 while the LED chip 910 is mounted in a flip-chip structure. Also, the second electrode 908b may be formed of a light-transmissive conductive material, such as a TCO, along a main light emission direction.

The two electrode structures described above may be electrically separated from each other via the insulation unit 903. The insulation unit 903 may be any material or object having electrical insulation characteristics, and may be preferably a material having a low light absorption ratio. For example, the insulation unit 903 may be silicon oxide or silicon nitride, such as $SiO_2$, $SiOxNy$, or $SixNy$. According to necessity, a light reflection structure may be formed by dispersing a light-reflective filler in a light-transmissive material.

The first and second electrode pads 919a and 919b may be respectively connected to the first and second electric connecting portions 909a and 909b and may function as an external terminal of the LED chip 910. For example, the first and second electrode pads 919a and 919b may be Au, Ag, Al, Ti, W, Cu, Sn, Ni, Pt, Cr, NiSn, TiW, or AuSn, or a eutectic metal of these. In this case, when mounting the LED chip 910 on a mounting substrate 920, they may be bonded by using a eutectic metal, and thus, an additional solder bump which is typically required in flip-chip bonding may not be used. Compared to when a solder bump is used, increased heat dissipating effects can be obtained by using the eutectic metal. In addition, in order to obtain excellent heat dissipating effects, the first and second electrode pads 919a and 919b may be formed to have a broad surface area.

A buffer layer (not shown) may be formed between the light-emitting structure S and the growth substrate 901, and of an undoped semiconductor layer formed of a nitride, to thereby reduce lattice defects of the light-emitting structure S grown thereon.

The growth substrate 901 may have first and second main surfaces facing each other, and a concave-convex structure may be formed on at least one of the first and second main surfaces. A concave-convex structure formed on a surface of the growth substrate 910 may be formed by partially etching the growth substrate 901 and thus may be formed of the same material as the growth substrate 901, or may also be formed of a heterogeneous material from that of the growth substrate 901.

According to the current embodiment of the inventive concept, by forming a concave-convex structure on an interface between the growth substrate 901 and the first conductivity-type semiconductor layer 904, paths of light emitted from the active layer 905 may vary, and as a result, a ratio of light absorbed by the semiconductor layer may be reduced and a light diffusion ratio may increase, thereby increasing light extraction efficiency.

In detail, the concave-convex structure may have a regular or irregular structure. Heterogeneous materials of the concave-convex structure may be, without limitation, a transparent conductor, a transparent insulator, or a highly reflective material. Examples of the transparent insulator include $SiO_2$, $SiNx$, $Al_2O_3$, HfO, $TiO_2$, and ZrO. Examples of the transparent conductor include a TCO, such as ZnO or indium oxide containing an additive (e.g., Mg, Ag, Zn, Sc, Hf, Zr, Te, Se, Ta, W, Nb, Cu, Si, Ni, Co, Mo, Cr, or Sn). Examples of a reflective material include Ag, Al, or a distributed Bragg reflector (DBR) including multiple layers having different refractive indices.

The growth substrate 901 may be removed from the first conductivity-type semiconductor layer 904. To remove the growth substrate 901, a laser lift-off (LLO) operation using a laser, or an etching or polishing operation may be used. Also, after the growth substrate 901 is removed, a concave-convex structure may be formed on a surface of the first conductivity-type semiconductor layer 904.

As illustrated in FIG. 9, the LED chip 910 is mounted on a mounting substrate 920. The mounting substrate 920 may include top and bottom electrode layers 912b and 912a respectively formed on upper and lower surfaces of a substrate main body 911, and a via 913 that is formed through the substrate main body 911 to connect the top and bottom electrode layers 912b and 912a. The substrate main body 911 may be resin, ceramic, or metal, and the top or bottom electrode layer 912b or 912a may be a metal layer, such as Au, Cu, Ag, or Al.

Obviously, the growth substrate 901, on which the LED chip 910 described above is mounted, is not limited to the form of the mounting substrate 920 illustrated in FIG. 9, and any substrate in which a wiring structure for driving circuit boards or LED chips as illustrated in FIGS. 4 through 6 are formed may be used as the growth substrate 901.

Figure 10:
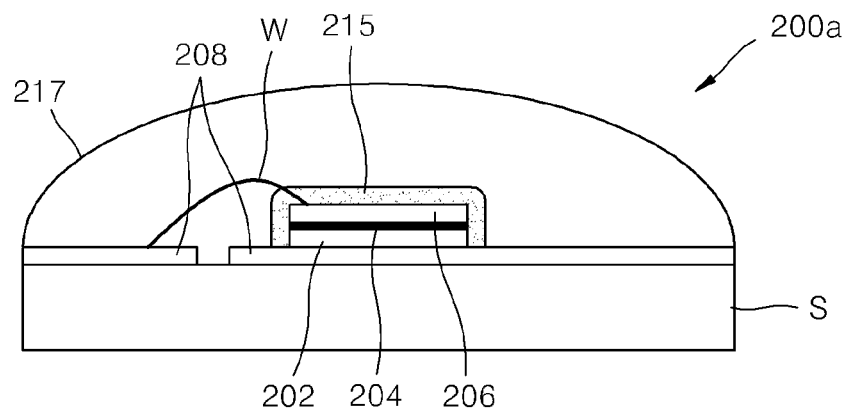
FIGS. 10 through 12 are cross-sectional views illustrating a LED package applied according to an embodiment of the inventive concept.

FIG. 10 is a cross-sectional view illustrating a LED package 200a applied to a lighting apparatus according to an embodiment of the inventive concept.

Referring to FIG. 10, the LED package 200a includes a phosphor layer 215 coated around a light-emitting chip including a first type semiconductor layer 202, an active layer 204, and a second type semiconductor layer 208 formed on a growth substrate S.

The growth substrate S may be a resin substrate, such as an FR4 or FR5 substrate. Alternatively, the growth substrate S may be formed of a ceramic or glass fiber.

The first type semiconductor layer 202, the active layer 204, and the second type semiconductor layer 206 may be formed of a compound semiconductor. For example, the first type semiconductor layer 202 and the second type semiconductor layer 206 may be a nitride semiconductor, that is, they may have a composition of $Al_xIn_yGa_{(1-x-y)}N(0≤x≤1, 0≤y≤1, 0≤x+y≤1)$, and may be doped with an n-type impurity and a p-type impurity, respectively. The active layer 204 formed between the first and second type semiconductor layers 202 and 206 emits light having predetermined energy due to the recombination of electrons and holes, and may have a structure in which a plurality of $In_xGa_{1-x}N$ (0≤x≤1) layers are stacked so as to adjust band gap energy according to a content of indium. In this case, the active layer 204 may have a MQW structure in which a quantum barrier layer and a quantum well layer are alternately stacked, and a content of indium may be adjusted such that blue light may be emitted.

The phosphor layer 215 may include a phosphor that absorbs blue light so as to alternatively emit red light and a phosphor that absorbs blue light so as to alternatively emit green light. Examples of the phosphor that excites red light include a nitride phosphor, such as MAlSiNx:Re (1≤x≤5) and a sulfide phosphor, such as MD:Re. Here, M is at least one selected from the group consisting of Ba, Sr, Ca, and Mg, and D is at least one selected from the group consisting of S, Se, and Te, and Re is at least one selected from the group consisting of Eu, Y, La, Ce, Nd, Pm, Sm, Gd, Tb, Dy, Ho, Er, Tm, Yb, Lu, F, Cl, Br, and I. Also, examples of the phosphor exciting green light include a silicate phosphor which is $M_2SiO_4$:Re, a sulfide phosphor which is $MA_2D_4$:Re, a phosphor which is β-SiAlON:Re, and an oxide phosphor which is $MA'_2O_4$:Re', where M is at least one element selected from the group consisting of Ba, Sr, Ca, and Mg, and A is at least one selected from the group consisting of Ga, Al, and In, and D is at least one selected from the group consisting of S, Se, and Te, and A' is at least one selected from the group consisting of Sc, Y, Gd, La, Lu, Al, and In, and Re is at least one selected from the group consisting of Eu, Y, La, Ce, Nd, Pm, Sm, Gd, Tb, Dy, Ho, Er, Tm, Yb, Lu, F, Cl, Br, and I, and Re' is at least one selected from the group consisting of Ce, Nd, Pm, Sm, Tb, Dy, Ho, Er, Tm, Yb, F, Cl, Br, and I.

A portion of blue light emitted from the active layer 204 is converted to red light, and another portion is converted to green light, and accordingly, blue light, red light, and green light are mixed to be emitted as white light.

An electrode pattern unit 208, including two isolated areas, is formed on the growth substrate S. The electrode pattern unit 208 may be formed of a material, such as Cu, Pd, Ag, or Ni/Au, and by using a process, such as plating. The first type semiconductor layer 202 is bonded to a portion of the electrode pattern unit 208, and the second type semiconductor layer 206 is bonded to another portion of the electrode pattern unit 208 by using a wire W.

Also, a cover layer 217 having a lens shape that protects the light-emitting chip and adjusts the directivity of light emitted from the light-emitting chip may be further formed. The cover layer 217 may be formed of a transparent material, such as a resin. The cover layer 217 is not limited to the illustrated shape, and may also include other shapes including a flat form which does not function as a lens but just protects the light-emitting chip.

Figure 11:
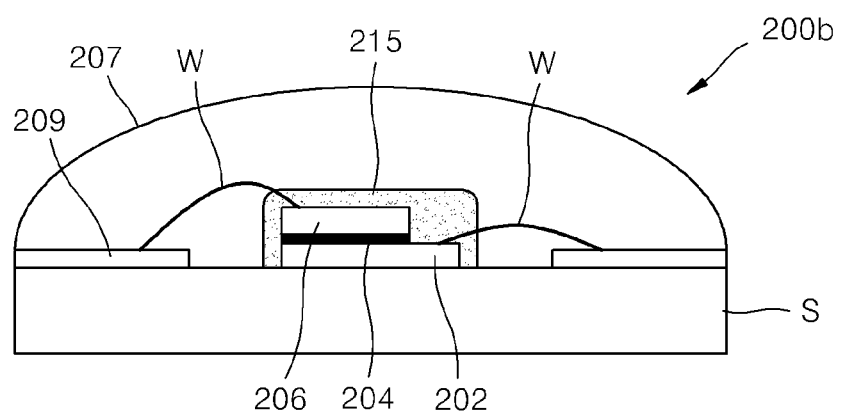

FIG. 11 is a cross-sectional view illustrating a LED package 200b applied to a lighting apparatus according to another embodiment of the inventive concept.

The LED package 200b according to the current embodiment of the inventive concept is different from the LED package 200a illustrated in FIG. 10 in terms of an electrode structure. That is, in the LED package 200b, a light-emitting chip, including a first type semiconductor layer 202, an active layer 204, and a second type semiconductor layer 206, is etched into a mesa structure such that a portion of the first type semiconductor layer 202 is exposed. The exposed portion of the first type semiconductor layer 202 is bonded to a portion of the electrode pattern unit 209 by using a wire W, and the second type semiconductor layer 206 is bonded to the other portion of the electrode pattern unit 209 by using a wire W.

Figure 12:
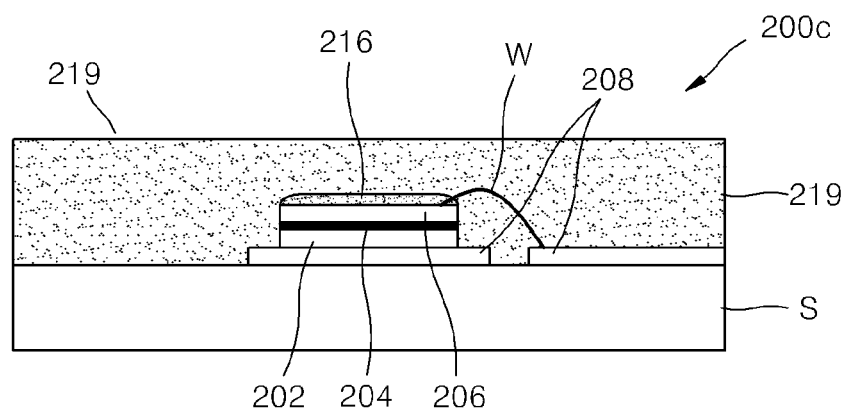

FIG. 12 is a cross-sectional view illustrating a LED package 200c applied to a lighting apparatus according to another embodiment of the inventive concept. The LED package 200c may include a phosphor layer 216. The phosphor layer 216 may be formed by coating a phosphor on an upper end portion of a light-emitting chip including a first type semiconductor layer 202, an active layer 204, and a second type semiconductor layer 206. A cover layer 219 illustrated in FIG. 12 is flat, but it is not limited thereto. The cover layer 219 may have a lens shape so as to adjust the directivity of light emitted from the light-emitting chip. Also, the cover layer 219 may be formed of a material in which a transparent material, such as a resin, and a phosphor are mixed.

Although the LED chips and LED packages applicable to the exemplary embodiments of the inventive concept are described above with reference to FIGS. 7 through 12, other various structures of the LED chips and LED packages may also be used.

Figure 13:
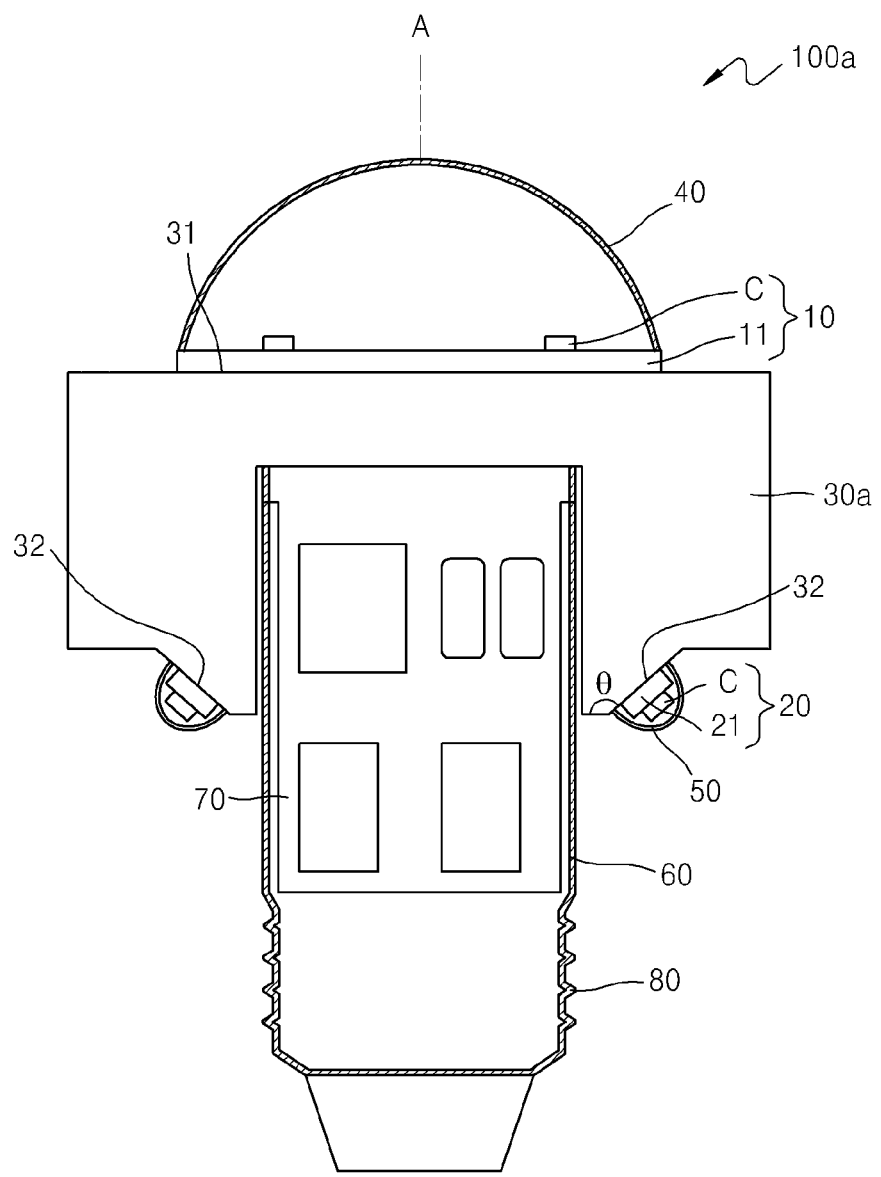
FIG. 13 is a side cross-sectional view of a lighting apparatus according to another embodiment of the inventive concept.

FIG. 13 is a side view illustrating a lighting apparatus 100*a* according to another embodiment of the inventive concept.

The lighting apparatus 100*a* includes a similar structure as that of the lighting apparatus 100 of FIG. 1 except for a heat dissipating unit 30*a* and a position of a second light-emitting module 20 disposed in the heat dissipating unit 30*a*.

The heat dissipating unit 30*a* may be disposed between a first light-emitting module 10 and the second light-emitting module 20, in a similar manner as described in reference to FIG. 1. The first light-emitting module 10 is disposed on a first surface 31 of the heat dissipating unit 30*a*, and the second light-emitting module 20 is disposed on a second surface 32 thereof, which is separated from the first surface 31. The first surface 31 is an upper surface of the heat dissipating unit 30*a*, and the second surface 32 may be a surface inclined at a predetermined angle (θ) with respect to the lower surface of the heat dissipating unit 30*a*. As the second light-emitting module 20 mainly emits light obliquely with respect to a center axis A of the lighting apparatus 100*a*, light distribution characteristics with respect to a side direction of the lighting apparatus 100*a* can be improved.

Figure 14:
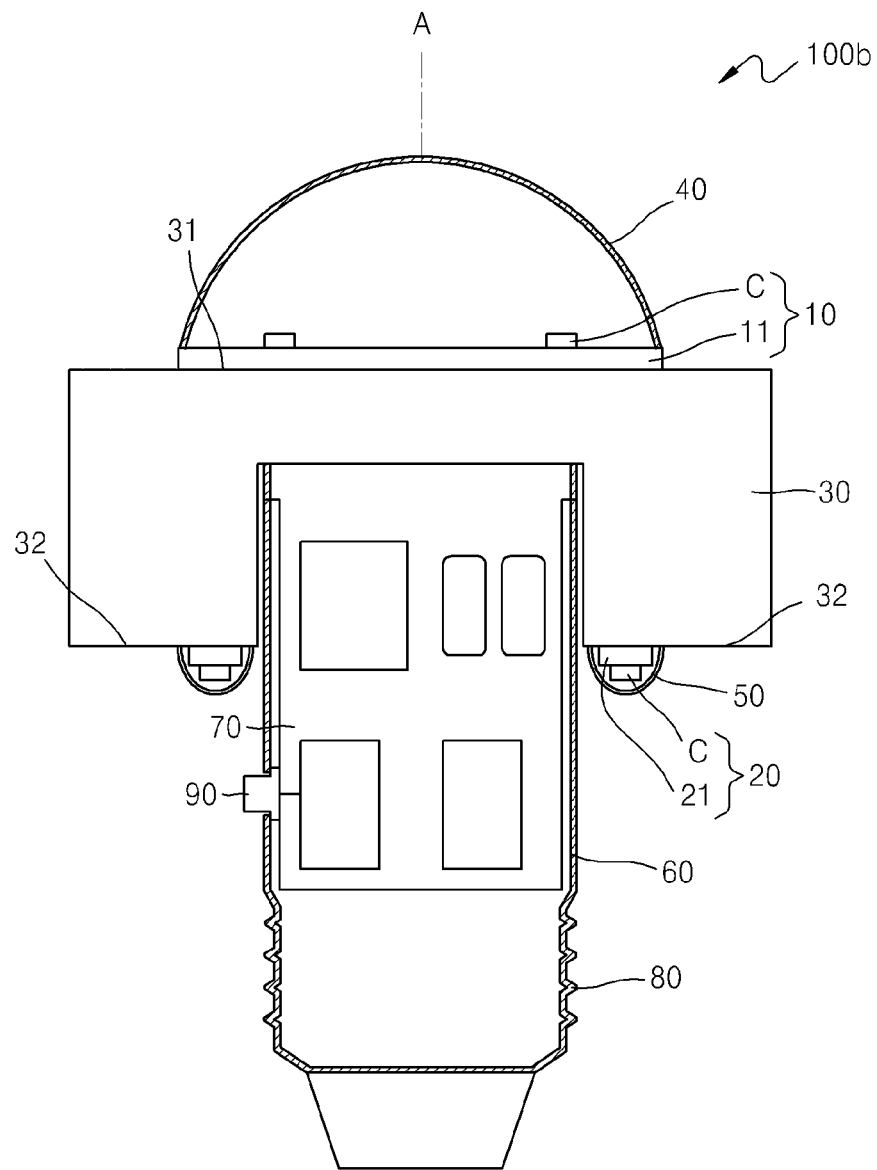
FIG. 14 is a side cross-sectional view of a lighting apparatus according to another embodiment of the inventive concept.

FIG. 14 is a side view illustrating a lighting apparatus 100*b* according to another embodiment of the inventive concept.

Referring to FIG. 14, the lighting apparatus 100*b* may include a first light-emitting module 10, a second light-emitting module 20, a heat dissipating unit 30, a driving circuit unit 70, a housing unit 60, and a switching unit 90. Also, the lighting apparatus 100*b* may further include covers 40 and 50 and a socket unit 80.

The lighting apparatus 100*b* of FIG. 14 is similar to the lighting apparatus 100 of FIG. 1. However, the lighting apparatus 100*b* additionally includes a switching unit 90 for controlling the driving circuit unit 70 from the outside.

The switching unit 90 is disposed at a side of the housing unit 60, and may be electrically connected to the driving circuit unit 70. The switching unit 90 may be a touch-type switching unit or a mechanical switching unit that uses a toggling method. The user may manipulate the switching unit 90 so that driving power generated in the driving circuit board 70 is selectively supplied to the first light-emitting module 10 and the second light-emitting module 20. Accordingly, the first and second light-emitting modules 10 and 20 may be controlled such that one of the first light-emitting module 10 and the second light-emitting module 20 selectively emits light or both emit light. Also, it may be controlled such that only some of light-emitting devices C included in the first light-emitting module 10 and the second light-emitting module 20 emit light or an intensity of light emitted from the light-emitting device C may be adjusted.

Figure 15:
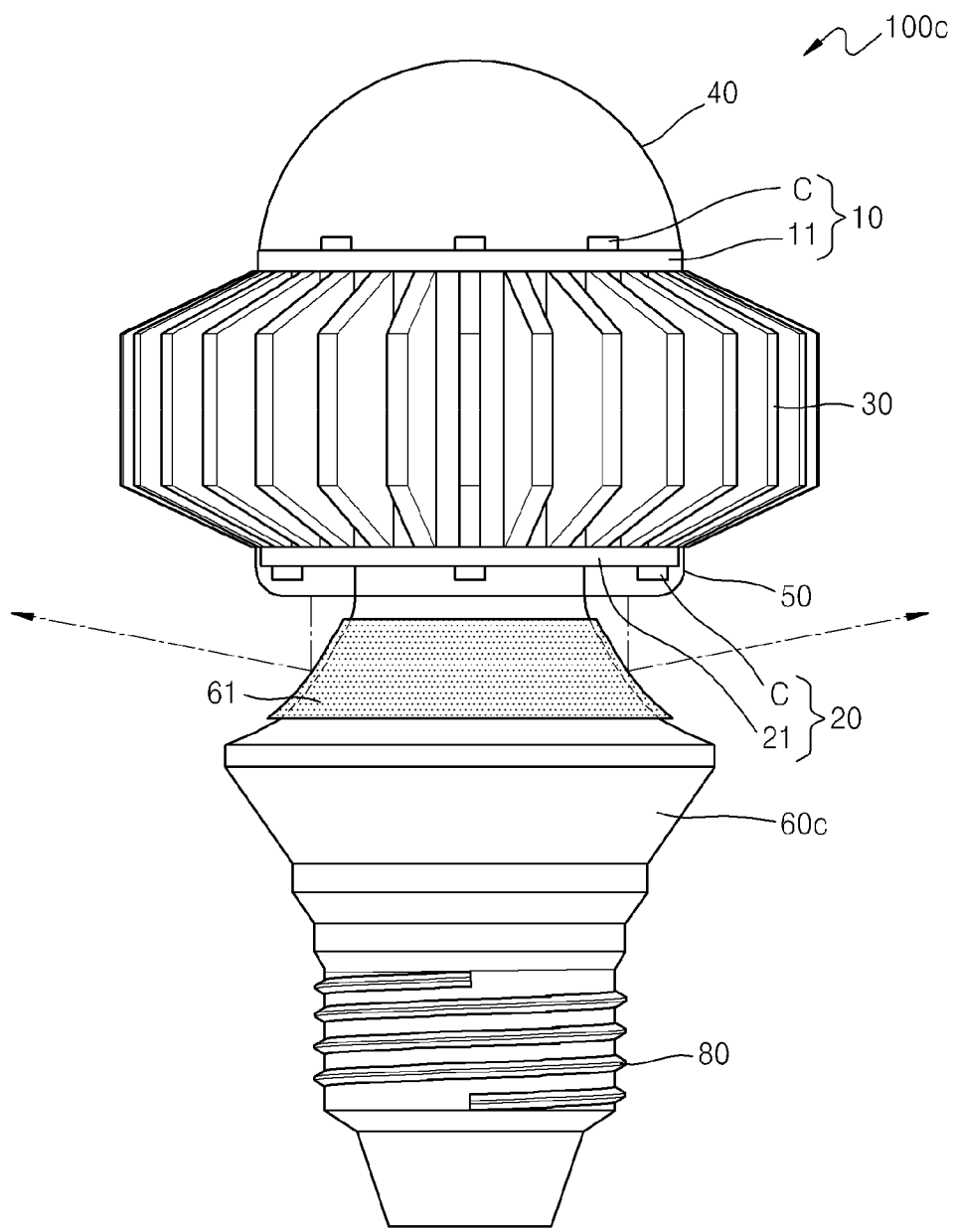
FIG. 15 is a side view of a lighting apparatus according to another embodiment of the inventive concept.

FIG. 15 is a side view illustrating a lighting apparatus 100*c* according to another embodiment of the inventive concept.

The lighting apparatus 100*c* according to the current embodiment of the inventive concept has a similar structure as the lighting apparatus 100 of FIG. 1 except that the lighting apparatus 100*c* further includes a reflecting unit 61 on an external surface of a housing unit 60*c*.

The reflecting unit 61 is disposed on at least a portion of an external circumferential surface of the housing unit 60*c* so as to reflect light emitted from the second light-emitting module 20. As illustrated in FIG. 15, the housing unit 60*c* may have an inclined external surface, and the reflecting unit 61 may be disposed on the inclined external surface of the housing unit 60*c*.

The reflecting unit 61 may be formed by mounting a reflector or a reflecting lens on the external surface of the housing unit 60*c*. Alternatively, the reflecting unit 61 may be formed by coating a reflective pigment on the external surface of the housing unit 60*c*.

The reflecting unit 61 may be formed by using a highly reflective material. Examples of materials used for the reflecting unit 61 include a high reflectivity white resin, metal, and a reflective pigment. As for the white resin, white foamed polyethylene terephthalate (PET) material or a white polycarbonate material may be used. Reflectivity of these materials is about 97%, and as loss of reflected light thereof is relatively small, a decrease in efficiency is also relatively small. As for the metal, a high reflectivity metal, for example, at least one selected from the group consisting of Ag, Al, Au, Cu, Pd, Pt, Rd, and an alloy of these may be used. The reflecting unit 61 may be formed by deposition. Alternatively, as a reflective pigment, a material in which at least one of reflective materials having a reflectivity of about 80% to 90% such as titanium oxide ($TiO_2$), zinc oxide (ZnO), or calcium carbonate ($CaCo_3$) may be used. The reflective pigment may be formed by diluting reflective materials in a solvent with an adhesive and coating the diluted product on a material, such as plastic. Coating may be performed by using, for example, a spray or a roller.

The reflecting unit 61 may improve light distribution characteristics. Light emitted from the second light-emitting module 20 is reflected by the reflecting unit 61 and is emitted in a side direction at various angles, and thus light distribution characteristics may be improved.

Figure 16:
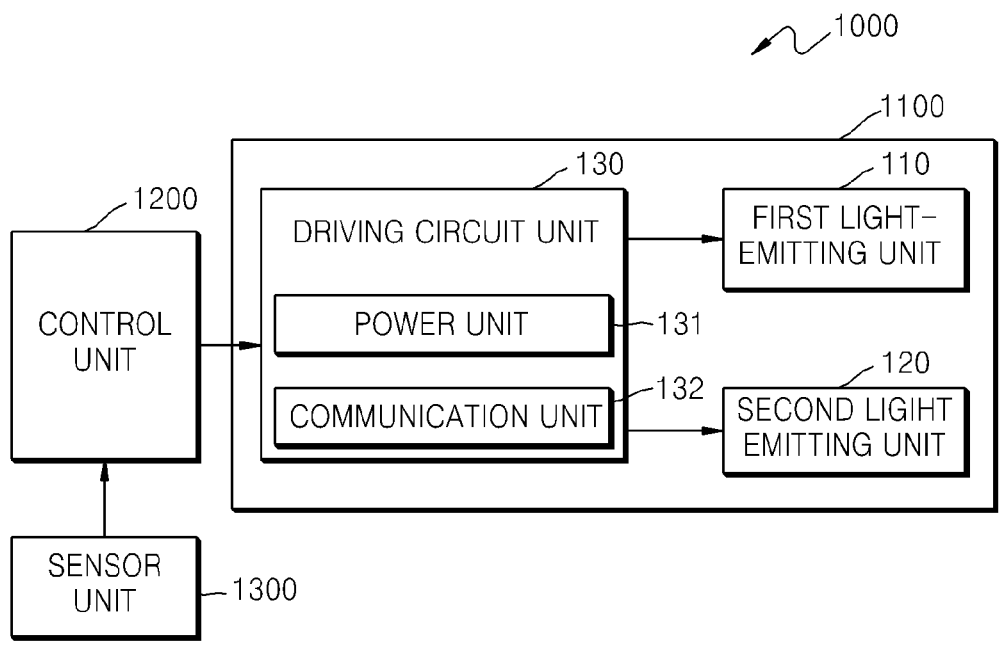
FIG. 16 is a block diagram illustrating a lighting system according to an embodiment of the inventive concept.

FIG. 16 is a block diagram illustrating a lighting system 1000 according to an embodiment of the inventive concept. Referring to FIG. 16, the lighting system 1000 may include a lighting apparatus 1100 and a control unit 1200 for controlling the lighting apparatus 1100. Also, the lighting system 1000 may further include a sensor unit 1300 that senses an external environment.

The lighting apparatus 1100 may be the lighting apparatuses 100, 100*a*, 100*b*, and 100*c* as illustrated in FIG. 1 and FIGS. 13 through 15 according to the exemplary embodiments of the inventive concept. The lighting apparatus 1100 may include a first light-emitting unit 110, a second light-emitting unit 120, and a driving circuit unit 130.

The first light-emitting unit 110 and the second light-emitting unit 120 may respectively be the first light-emitting module 10 and the second light-emitting module 20 of the lighting apparatuses 100, 100*a*, 100*b*, and 100*c* according to the exemplary embodiments of the inventive concept. The first and second light-emitting units 110 and 120 may each include at least one light-emitting device. Also, structurally, a heat dissipating unit may be disposed between the first and second light-emitting units 110 and 120 to dissipate heat generated in the first and second light-emitting units 110 and 120.

The driving circuit unit 130 provides driving power to the first light-emitting unit 110 and the second light-emitting unit 120. The driving circuit unit 130 may include a power unit 131 and a communication unit 132. The power unit 131 may convert power provided from the outside to driving power that is appropriate to drive the first and second light-emitting units 110 and 120.

The communication unit 132 may communicate with outside devices in accordance with a wired/wireless communication protocol in various manners. For example, the communication unit 132 may receive a control signal from the control unit 1200.

The driving circuit unit 130 controls light emission of the first light-emitting unit 110 and the second light-emitting unit 120 in response to the control signal received via the communication unit 132. The driving circuit unit 130 may vary the time when driving power is applied or an amount of driving power. Also, the driving circuit unit 130 may selectively provide driving power to the first light-emitting unit 110 and the second light-emitting unit 120, or if a plurality of driving devices are included in the first light-emitting unit 110 and the second light-emitting unit 120, driving power may be selectively provided only to some of the driving devices.

The control unit 1200 controls light emission of the lighting apparatus 1100. The control unit 1200 generates a control signal for controlling light-emitting characteristics of the lighting apparatus 1100 according to a user's manipulation or according to an external environment. For example, the control unit 1200 may generate a signal for controlling driving power that is provided to each of the first light-emitting unit 110 and the second light-emitting unit 120 of the lighting apparatus 1100.

Also, when the lighting system 1000 includes a sensor unit 1300, the control unit 1200 may calculate an amount of external light provided to the sensor unit 1300 and may generate a dimming control signal corresponding to the calculated luminous intensity of the surroundings. Also, the control unit 120 may generate a control signal that adjusts a color, temperature, and luminance of light generated in the lighting apparatus 1100 according to various conditions of external environments, such as temperature or moisture. Accordingly, characteristics of light emitted from the lighting apparatus 1100 may be adaptively adjusted according to the surroundings or environmental conditions.

While the control unit 1200 is shown separately from the lighting apparatus 1100 in FIG. 16, the control unit 1200 may also be included in the lighting apparatus 1100. Alternatively, the control unit 1200 may be included in a wireless terminal, such as a smart phone or the like.

Figure 17:
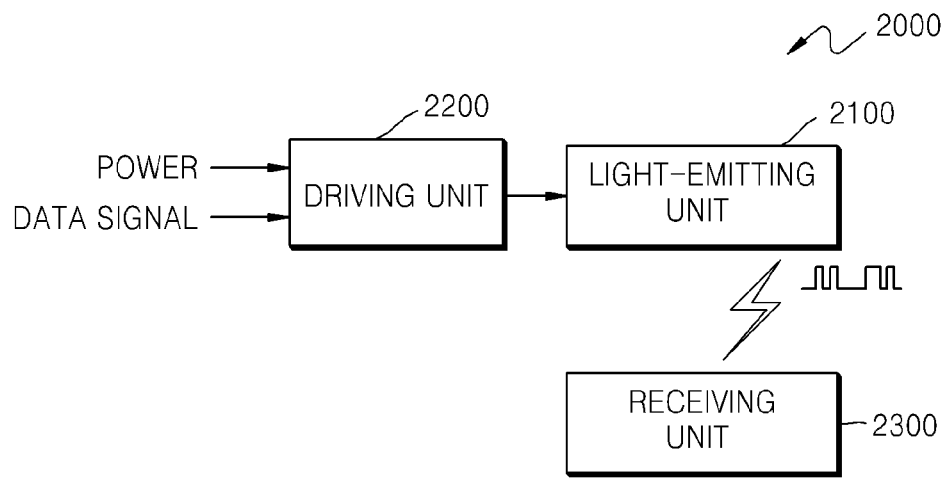
FIG. 17 is a block diagram of a visible light communication system according to an embodiment of the inventive concept.

FIG. 17 is a block diagram illustrating a visible light communication (VLC) system 2000 according to an embodiment of the inventive concept.

VLC is a wireless communication technology whereby information is transmitted wirelessly via light of a visible wavelength band which is perceivable by human eyes. Communication using visible rays does not generate an electronic wave and thus it is harmless and safe to the human body, and may be performed by using typical illumination or power lines. Thus, the usability or applicability of VLC is relatively high. Although information may be transmitted wirelessly by using all types of visible light, particularly light from a LED light source has a fast switching speed and may be digitally controlled, so that information may be easily transmitted. Thus, light from a LED light source is appropriate for VLC.

Referring to FIG. 17, the VLC system 2000 may include a light-emitting unit 2100, a driving unit 2200, and a receiving unit 2300.

The light-emitting unit 2100 is a lighting apparatus that emits visible rays and may be used as a transmitting unit of VLC. Light emitted from the light-emitting unit 2100 includes a signal modulated for wireless communication. For example, a pulse width of an intensity of light emitted from the light-emitting unit 2100 is modulated, and thus may include binary data. The light-emitting unit 2100 may include, as a lighting apparatus according to the exemplary embodiments of the inventive concept disclosed herein, at least two light-emitting modules that each include at least one light-emitting device. The light-emitting device may include a LED. As the lighting apparatuses according to the exemplary embodiments of the inventive concept include two light-emitting modules having different light emission directions, one of the two light-emitting modules may be used as a transmitting unit for performing VLC.

The driving unit 2200 generates a signal for driving the light-emitting unit 2100. The driving unit 2200 may generate a control signal for controlling fast light emission and extinction of the light-emitting unit 2100. A control signal may be generated by using power or a data signal provided from the outside. For example, the driving unit 2200 may modulate a pulse of power by using a data signal to generate a control signal. Also, a control signal may be a driving voltage, a pulse width or a voltage intensity of which is modulated so that the control signal may include a data signal. When the light-emitting unit 2100 is used as both a transmitting unit of wireless communication and lighting, the driving unit 2200 may control light-emitting characteristics of the light-emitting unit 2100 such that humans may not perceive blinking of light according to light emission and extinction of the light-emitting unit 2100.

The receiving unit 2300 may perform communication with an external device by using visible rays emitted from the light-emitting unit 2100. The receiving unit 2300 may include an optical detecting unit and an amplifier or the like in order to extract a data signal by receiving a visible ray. The receiving unit 2300 may be a mobile terminal, such as a portable telephone, and may also be various electronic devices which are capable of performing wireless communication.

While the inventive concept has been particularly shown and described with reference to exemplary embodiments thereof, it will be understood that various changes in form and details may be made therein without departing from the spirit and scope of the present invention as defined by the following claims.

What is claimed is:
1. A lighting apparatus comprising:
a first light-emitting module emitting light;
a second light-emitting module emitting light in a direction different from the first light-emitting module;
a heat dissipating unit that is interposed between the first and second light-emitting modules and dissipates heat generated in the first and second light-emitting modules;
a driving circuit unit providing driving power to the first light-emitting module and the second light-emitting module; and
a housing unit in which the driving circuit unit is disposed, wherein:
the heat dissipating unit has a cylindrical shape including a central inner space, and
an upper portion of the housing unit is disposed in the inner space.

2. The lighting apparatus of claim 1, wherein the first light-emitting module is disposed on a first surface of the heat dissipating unit, and the second light-emitting module is disposed on a second surface of the heat dissipating unit that is separated from the first surface.

3. The lighting apparatus of claim 2, wherein the second surface is opposite to the first surface.

4. The lighting apparatus of claim 2, further comprising:
a first cover disposed on the first surface of the heat dissipating unit to protect the first light-emitting module; and a second cover disposed on the second surface of the heat dissipating unit to protect the second light-emitting module.

5. The lighting apparatus of claim 4, wherein the first and second covers are formed of a transparent material in which a diffusion material is mixed, to diffuse light emitted from the first and second light-emitting modules.

6. The lighting apparatus of claim 1, wherein the first light-emitting module and the second light-emitting module each comprise:
   at least one light-emitting device; and
   a circuit board on which the at least one light-emitting device is mounted.

7. The lighting apparatus of claim 1, wherein
   the first light-emitting module is disposed on an upper surface of the heat dissipating unit, and the second light-emitting module is disposed on a lower surface of the light-emitting module to surround the housing unit.

8. The lighting apparatus of claim 1, further comprising a switching unit that controls the driving power to be selectively provided to the first light-emitting module and the second light-emitting module.

9. The lighting apparatus of claim 1, wherein a reflecting unit reflecting a portion of light emitted from the second light-emitting module is disposed on an external surface of the housing unit.

10. The lighting apparatus of claim 9, wherein the reflecting unit is formed by coating a highly reflective material on the housing unit.

11. The lighting apparatus of claim 1, wherein the heat dissipating unit comprises a plurality of heat dissipation fins.

12. A lighting system comprising:
   a lighting apparatus comprising a first light-emitting unit and a second light-emitting unit that each include at least one light-emitting device and emit light in different directions and a heat dissipating unit that is interposed between the first and second light-emitting units and dissipates heat;
   a control unit that controls driving power provided to each of the first and second light-emitting units;
   a driving circuit unit that supplies power to the first light-emitting unit and the second light-emitting unit;
   a housing unit that insulates the driving circuit unit from the outside; and
   a socket unit that connects external power to the driving circuit unit.

13. The lighting system of claim 12, further comprising a sensor unit that senses an amount of external light,
   wherein the control unit calculates near luminous intensity by using a signal output from the sensor unit and generates a control signal corresponding to the near luminous intensity.

14. A lighting apparatus comprising:
   at least two light-emitting modules disposed on different surfaces of a heat dissipating unit, wherein the at least two light-emitting modules are configured to emit light in different directions
   wherein each light-emitting module includes a nano-light-emitting structure.

15. The lighting apparatus of claim 14, wherein the different surfaces include a first surface and a second surface opposed to the first surface of the heat dissipating unit.

16. The lighting apparatus of claim 14, further comprising at least two covers disposed on the different surfaces of the heat dissipation unit, wherein the at least two covers are configured to protect the at least two light-emitting modules.

17. The lighting apparatus of claim 14, wherein the nano-light-emitting structure comprises a first conductive type semiconductor layer, as a nano-core, and an active layer and a second conductive type semiconductor layer, as shell layers, surrounding the nano-core.

* * * * *